United States Patent
Breil

(10) Patent No.: US 9,373,512 B2
(45) Date of Patent: Jun. 21, 2016

(54) APPARATUS AND METHOD FOR LASER HEATING AND ION IMPLANTATION

(71) Applicant: GLOBALFOUNDRIES INC., Grand Cayman (KY)

(72) Inventor: Nicolas Breil, Wappinger Falls, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 232 days.

(21) Appl. No.: 14/094,819

(22) Filed: Dec. 3, 2013

(65) Prior Publication Data

US 2015/0155172 A1 Jun. 4, 2015

(51) Int. Cl.
- *H01L 21/425* (2006.01)
- *H01L 21/268* (2006.01)
- *H01L 21/265* (2006.01)

(52) U.S. Cl.
CPC ........ *H01L 21/268* (2013.01); *H01L 21/26546* (2013.01); *H01L 21/26586* (2013.01)

(58) Field of Classification Search
CPC . H01L 21/046; H01L 21/263; H01L 21/2636; H01L 21/324; H01L 21/67115
USPC .................. 438/514, 522, 530, 550
See application file for complete search history.

(56) References Cited

U.S. PATENT DOCUMENTS

| | | | |
|---|---|---|---|
| 6,413,802 B1 | 7/2002 | Hu et al. | |
| 7,135,392 B1 * | 11/2006 | Adams | B23K 26/0604 257/E21.337 |
| 7,323,389 B2 | 1/2008 | Goktepeli et al. | |
| 7,341,902 B2 | 3/2008 | Anderson et al. | |
| 8,461,033 B2 * | 6/2013 | Kato | H01L 21/67115 250/492.2 |
| 8,461,553 B2 | 6/2013 | Bateman et al. | |
| 2005/0067384 A1 | 3/2005 | Talwar et al. | |
| 2007/0232033 A1 | 10/2007 | Wieczorek et al. | |
| 2008/0311732 A1 | 12/2008 | Dokumaci et al. | |
| 2009/0068825 A1 * | 3/2009 | Poon | H01L 21/324 438/550 |
| 2011/0171795 A1 | 7/2011 | Tsai et al. | |
| 2012/0135578 A1 | 5/2012 | Steen et al. | |

FOREIGN PATENT DOCUMENTS

WO 2011161965 12/2011

OTHER PUBLICATIONS

"Formation of Amorphous Silicon by Ion Bombardment as a Function of Ion, Temperature, and Dose", Morehead, et al., Journal of Applied Physics, vol. 43, No. 3, Mar. 1972.
"Solid Phase Epitaxy Versus Random Nucleation and Growth in Sub-20 nm Wide Fin Field-Effect Transistors", Duffy, et al., 2007 American Institute of Physics.

(Continued)

*Primary Examiner* — Kevin M Picardat
(74) *Attorney, Agent, or Firm* — Hoffman Warnick LLC; Catherine Ivers

(57) ABSTRACT

An apparatus and method for performing ion implantation while minimizing and/or repairing amorphization of the substrate material. The process comprises exposing a substrate to an ion beam and either concurrently or promptly following the ion implantation using a laser to anneal the surface. In addition, a laser may be utilized to preheat the substrate prior to ion implantation. The laser heats the substrate to a temperature that does not cause the resist layer to be damaged. By utilizing a laser to heat the substrate from the top surface the resist is not damaged allowing for the use of photo resist material.

19 Claims, 10 Drawing Sheets

(56) References Cited

OTHER PUBLICATIONS

"Doping Engineering for Front-End Processing", van Dal., et al., Materials Research Society Symposium Proceedings vol. 1070.
"Improved fin width scaling in fully-depleted FinFETs by source-drain implant optimization", Duffy, et al., 2008 IEEE; pp. 334-337.
"300mm FinFET Results Utilizing Conformal, Damage Free, Ultra Shallow Junctions (Xj~5nm) Formed with Molecular Monolayer Doping Technique", Ang, et al., 2011 IEEE; pp. 35.5.1-35.5.4.
"Plasma Doping and Reduced Crystalline Damage for Conformally Doped Fin Field Effect Transistors", Lee, et al., Applied Physics Letters 102, 223508 (2013).
"A Novel Plasma-based Technique for Conformal 3D FINFET Doping", Han, et al., 2012 IEEE.
"Junction Strategies for 1x nm Technology Node With FINFET and High Mobility Channel", Horiguchi, et al., 2012 IEEE.
"Doping of Sub-50nm SOI Layers", Pawlak, et al., 2008 Materials Research Society, pp. 169-175.

\* cited by examiner

APPARATUS AND METHOD FOR LASER HEATING AND ION IMPLANTATION

FIELD OF THE INVENTION

The present invention relates to methodologies and an apparatus for ion implantation with an immediate annealing of the semiconductor element.

BACKGROUND

Ion implantation is a standard technique for introducing conductivity-altering impurities into a silicon device such as a transistor. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity. In a Complementary MOSFET (CMOS) technology, the ion implantation process will generally be performed on semiconductor wafers, on which certain area have been protected by a photolithographic resist. Using this standard technique, the only areas that will receive the ion implantation are the areas that are not covered by the photolithographic resist.

The process of ion implantation is well known to cause some amorphization damage in the context of FinFET devices. The conventional solution used in the industry, is the so-called Hot Implant solution, in which a chuck is heated at typically 400° C. during a conventional ion implantation. Hot implantation is currently utilized for FinFET doping without damaging the Fin through amorphization. The major downside of this approach is that the photolithographic resist may not be compatible with a 400° C. temperature. The resist that are used in the industry can generally withstand temperatures up to 200° C. When submitted to higher temperature bake, the organic based resist simply melt or evaporate, leaving some organic contamination on the wafer. This is a greater concern with hot chuck anneals or lamp based anneals, that have an annealing time ranging between one second and several minutes. The inventors have determined that the resist may withstand much higher temperatures when using a laser annealing process. Using a laser annealing brings the wafer up to a temperature of about 400 C during a typical timescale of 1 ms.

SUMMARY

The inventors have proposed a new and novel approach to perform ion implantation, while simultaneously annealing. An apparatus for implanting into a substrate comprising an ion implanter for producing an ion beam to implant into a substrate. A laser is adapted to anneal the substrate either prior to the ion implantation, simultaneously with the ion implantation, or promptly after the ion implantation. By heating the surface of the substrate with a laser in a close proximity to the time in which the ion implantation is performed, amophization may be avoided. The laser heats the surface of the substrate to a temperature at or above 400° C. for a time period of approximately 1 millisecond. The inventors have noted that laser heating the surface of the substrate does not cause the same damage to the resist layer as conventional methods of heating the entire substrate above 200° C. may. The conventional methods may include a lamp based anneal and hot plate anneal. The conventional methods heat the entire substrate and the heating lasts for a period of time greater than that of the laser anneal.

When the laser follows the ion implanter, the laser may be focused about 500 μm or less behind the ion beam. In one embodiment a second laser is used to preheat the substrate. In another embodiment a heating element to preheat the substrate. The preheating may be to about 200° C.

In another embodiment the laser precedes the ion beam to preheat the surface to a temperature of about 400° C. The laser may be focused about 500 μm or less before the ion beam. In addition as with the prior embodiment, a second laser may be used to preheat the substrate. In another embodiment a heating element to preheat the substrate. The preheating may be to about 200° C.

The process may comprise the steps of forming a semiconductor element on a substrate and exposing said semiconductor element to an ion beam. Promptly after the ion implantation the substrate is exposed a laser beam to heat the area exposed to the ion beam to a temperature of 400° C. and anneal the semiconductor element. The method may comprise the step of preheating the substrate to a temperature of 200° C.

In another embodiment the process may comprise the steps of forming a semiconductor element on a substrate. The substrate is then exposed to a laser beam to heat the semiconductor element above a predetermined temperature of approximately 400° C. Promptly after heating the substrate, the substrate is exposed an ion beam. The substrate may be preheated to a temperature of 200° C.

In another embodiment the process may comprise the steps of forming a semiconductor element on a substrate. Concurrently an area of the substrate is exposed to a laser beam and an ion beam, wherein the laser beam heats the section of said semiconductor element to a predetermined temperature of approximately 400° C.

DETAILED DESCRIPTION

Figure 1:
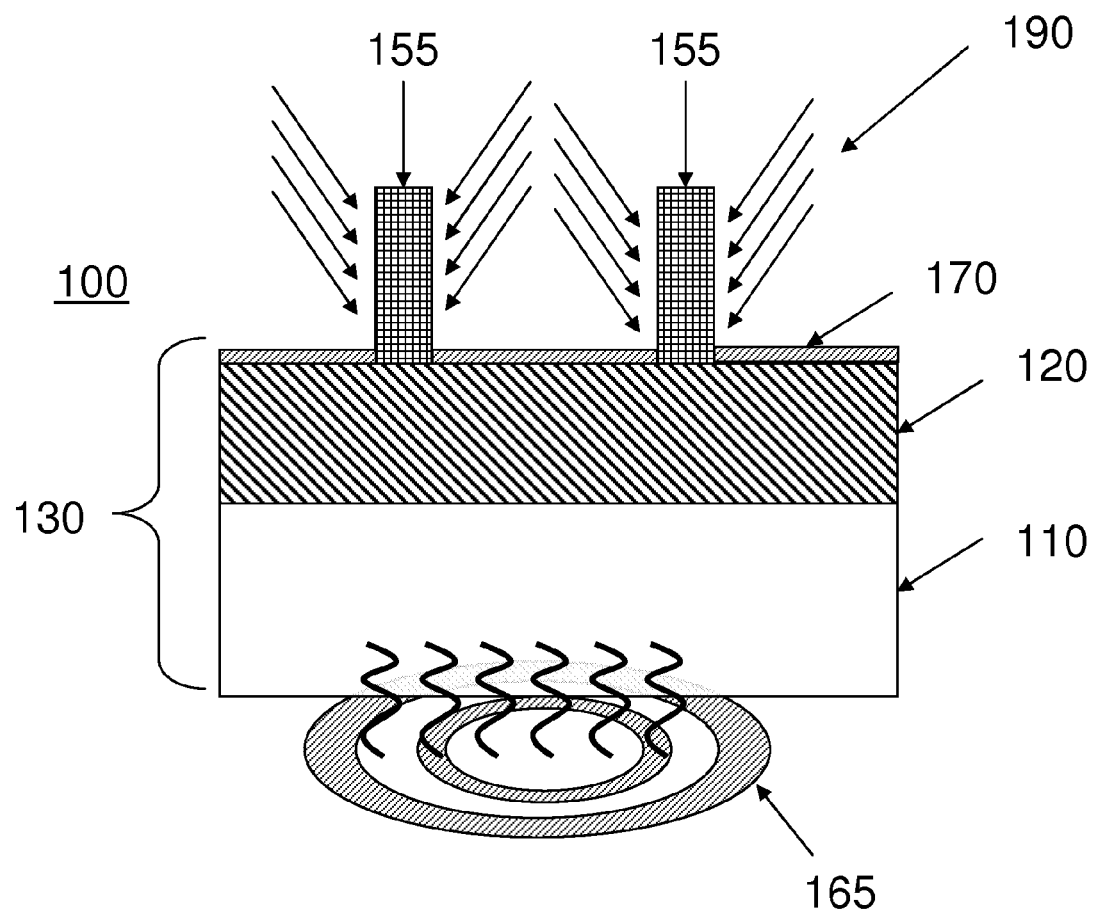
FIG. 1 illustrates a side view of a prior art embodiment of an apparatus to prevent amorphization during Ion implantation.

Referring to the drawings, FIG. 1 illustrates a side view of a prior art embodiment of an apparatus to prevent amorphization during ion beam deposition. Silicon device 100 comprises substrate 130 comprising silicon. In one embodiment the substrate 130 comprises a buried oxide layer 120 which may be grown on silicon substrate 110. The buried oxide layer 120 is optional; a device with a buried oxide layer 120 on silicon substrate 110 is often referred to as an SOI (Silicon On Insulator) device. When the buried oxide layer 120 is not present, the substrate 130 may be referred as a bulk substrate device. The substrate 130 may have multiple silicon elements 155 grown either on the silicon substrate 110 or buried oxide layer 120. The silicon elements 155 may be MOSFET transistors for example as shown in this embodiment a FinFET, which is a FET transistor made with a semiconductor fin 155. While only two fins 155 are shown on the substrate 130, real world applications would involve many million fins 155 be present.

Once the FinFET 155 has been defined, a resist layer 170 is added to prevent implantation of impurities on areas of the substrate 130. An ion beam 190 is used to implant impurities into the FinFET 155 for the purpose of introducing conductivity-altering impurities into the FinFET 155. During the ion deposition the semiconductor crystal in the fins 155 may be damaged, such as becoming amorphous. The amorphization threshold is the point where the fin amorphizes, this threshold depends upon the ion implantation dose, the ion implantation rate (i.e. the number of ions being implanted per unit of surface and per unit of time), and the temperature of the semiconductor area being implanted, in this case, the semiconductor fin. To prevent damage and or repair the damage one common prior art method is to provide a heating element 165 to the silicon device 100. Heating element 165 heats the silicon wafer 100 uniformly to about 400° C. Once the silicon wafer 100 has been heated to or above 400° C., the implant is no longer resist compatible. Photolithography resist are generally used in CMOS technology to protect some areas from receiving the ion implantation. For example, one would want to protect the n-type MOSFETs source and drain regions from receiving a p-type (e.g. Boron) dopant. An example resist material may include UVIIHS sold by DOW. While this resists may be used others know to those skilled in the art may also be used. Providers of resists include TOK, Sumika Electronic Materials, JSR, Dow and Shin-etsu Chemical. The resist 170 may be a common industry resist that can withstand temperatures up to 200 C. When submitted to a higher temperature bake, the organic based resist 170 may melt or evaporate, leaving some organic contamination on the wafer. In addition, by exposing the silicon device 100 to too high a temperature and or for an extended period of time, detrimental effects may result. These effects may include surface oxidation, species diffusion, and metal gate stability.

Figure 2:
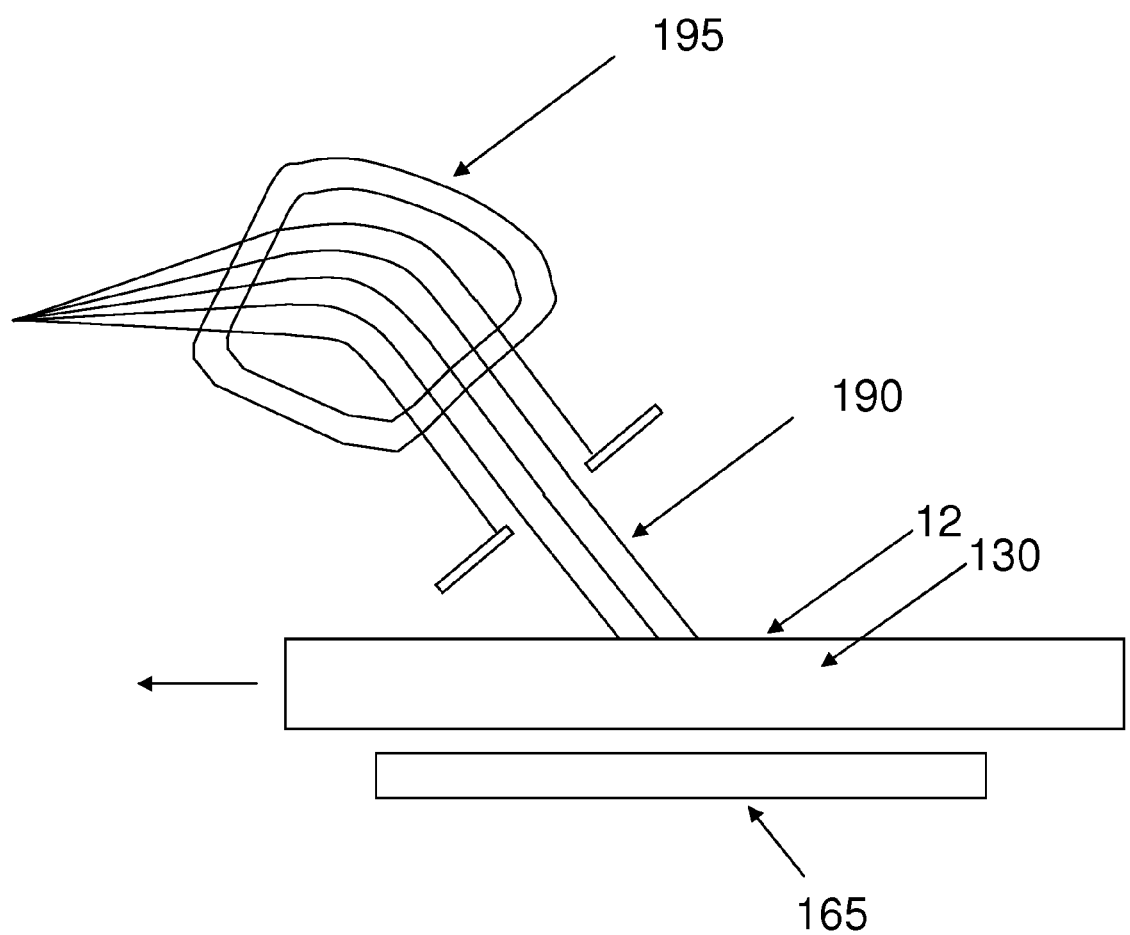
FIG. 2 illustrates a prior art embodiment of an ion implantation system.

FIG. 2 illustrates a prior art embodiment of an ion implantation system. FIG. 2 illustrates a system for ion beam 190 implantation. Ion source 195 provides an ion beam 190 to the top surface 12 of substrate 130. Substrate 130 is fastened to movable chuck (not shown) that moves in horizontal direction as shown. In this manner the ion beam is swept across the surface of wafer 130. The ion beam 190 sweeps across the substrate 130 and structures such as field effect transistors including but not limited to finfets. In this particular case, the ion beam comes with a specific angle with respect to the normal axis to the wafer. However, this invention is not limited to a specific angle, and the usefulness of the invention covers a wide range of angles. As the ion beam 190 sweeps across the substrate areas not protected by the resist layer (170 of FIG. 1) will have ions implanted. To correct for damage a heating element 165 is added. Heating element 165 may heat the substrate 130 to 400° C. As discussed earlier, the inventors have noted that this temperature may degrade or damage the resist (170 of FIG. 1. Examples of an ion beam implantation device may be found in U.S. Pat. No. 8,461,553. In the prior art ion implementations a hard mask, which consists of an insulator layer (such as silicon oxide, silicon nitride, titanium nitride or a combination of these materials) that can withstand the 400 C temperature used during the hot implant process. However, the use of a hard mask may create additional issues such removal of the hard mask may cause damage. Where as the use of a photo resist material does not have the same risk.

Figure 3:
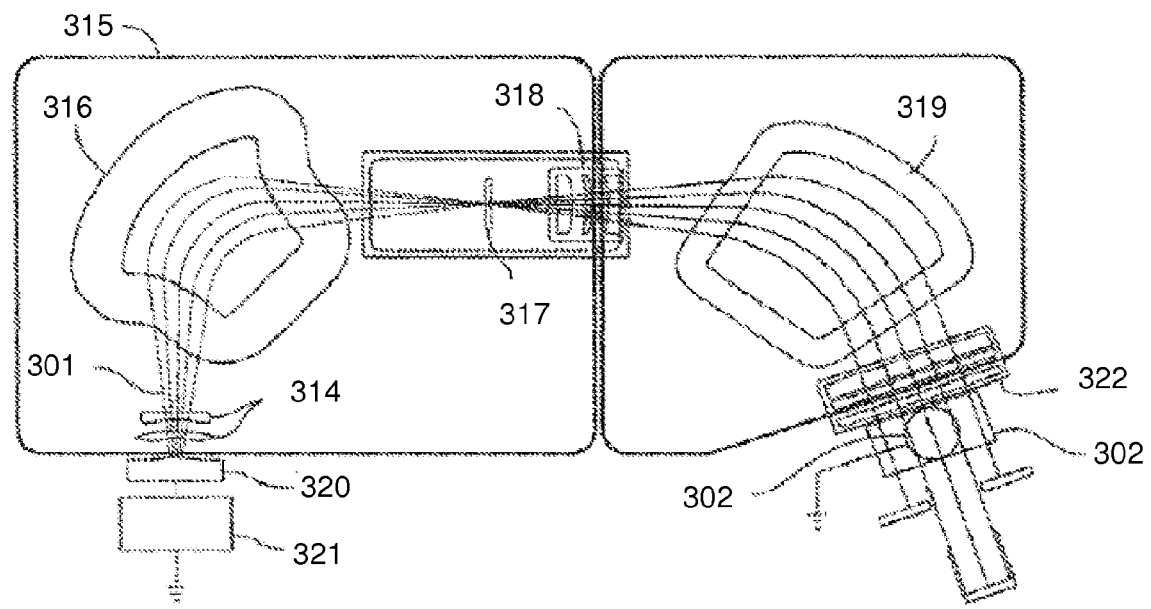
FIG. 3 illustrates a prior art block diagram of an ion implanter including an ion source chamber.

FIG. 3 is a block diagram of an ion implanter 315 including an ion source chamber 320. A power supply 321 supplies the required energy to source chamber 320 which is configured to generate ions of a particular species. The generated ions are extracted from the source through a series of electrodes 314 and formed into a beam 301 which passes through a mass analyzer magnet 316. The mass analyzer is configured with a particular magnetic field such that only the ions with a desired mass-to-charge ratio are able to travel through the analyzer for maximum transmission through the mass resolving slit 317. Ions of the desired species pass from mass slit 317 through deceleration stage 318 to corrector magnet 319. Corrector magnet 319 is energized to deflect ion beamlets in accordance with the strength and direction of the applied magnetic field to provide a ribbon beam targeted toward a substrate (130 in FIG. 1) positioned on support (e.g. platen) 302. In some embodiments, a second deceleration stage 322 may be disposed between corrector magnet 319 and support 302. The ions lose energy when they collide with electrons and nuclei in the substrate and come to rest at a desired depth within the substrate based on the acceleration energy. A mask (not shown) may be disposed proximate the substrate (130 in FIG. 1) in a process chamber which houses platen 302.

Figure 4:
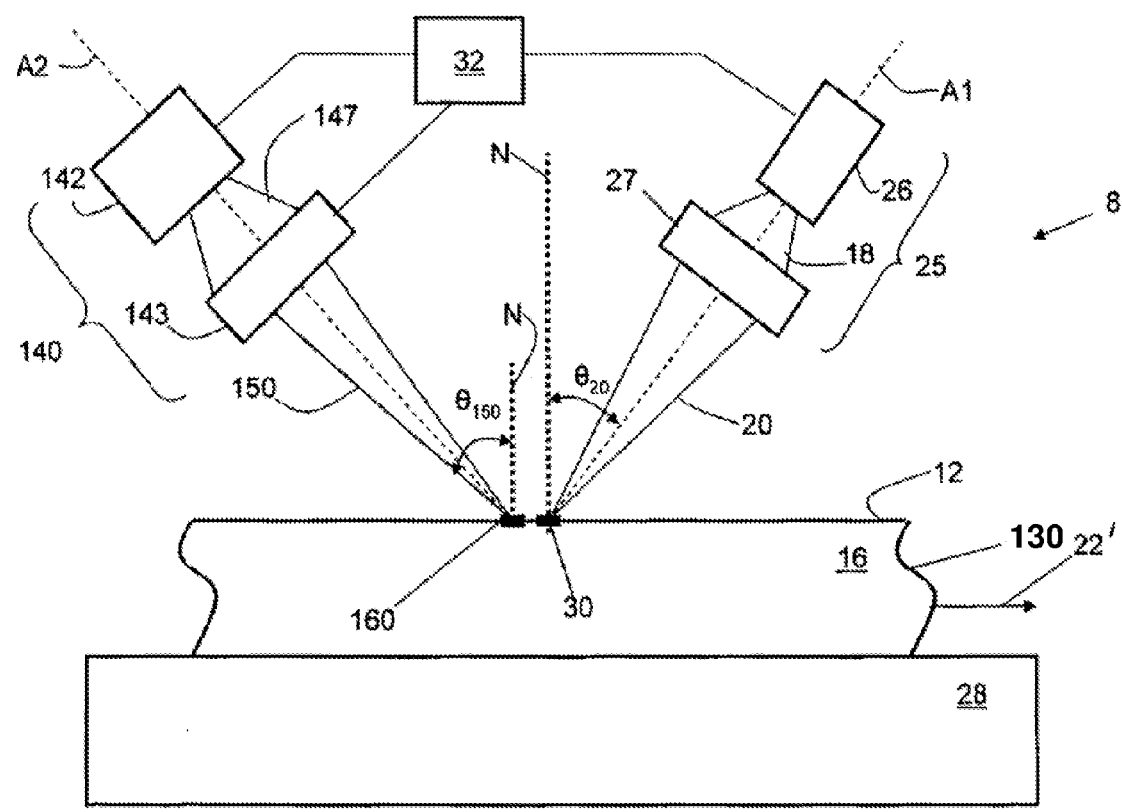
FIG. 4 illustrates a prior art embodiment of a laser annealing system.

FIG. 4 illustrates a prior art embodiment of a laser annealing system. Substrate 10 is annealed utilizing lasers 20 and 150. Substrate 130 has an upper surface 12 and a body (bulk) region 16. The reference letter N denotes the normal to substrate upper surface 12. In an example embodiment, substrate 10 is a silicon Wafer. Laser thermal annealing (LTA) apparatus 8 includes an LTA optical system 25 having an annealing radiation source 26 and an LTA lens 27 arranged along an optical axis A1. Lens 27 receives continuous (i.e., non-pulsed) annealing radiation 18 from annealing radiation source 26 and creates a continuous annealing radiation beam 20 that forms an image 30 (e.g., a line image) at substrate surface 12. Annealing radiation beam 20 is incident upper surface 12 at an incident angle $\theta_{20}$ as measured relative to surface normal N and optical axis A1.

Arrow 22 indicates an example direction of motion of annealing radiation beam 20 relative to substrate surface 12. Substrate 10 is supported by a chuck 28, which in turn is supported by a movable stage to move at select speeds and directions relative to annealing radiation beam 20 or some other reference. The scanning movement of chuck 28 is indicated by arrow 22'.

Apparatus 8 may include a preheating optical relay system 140 having a preheating radiation source 142 and a relay lens 143 arranged along an optical axis A2. Preheating radiation source 142 is one that emits radiation 147 that is applied to relay lens 145 With preheating radiation beam 150 therefore used to preheat the substrate just before it is heated by the annealing radiation beam. Radiation 147 has a Wavelength that is readily (substantially) absorbed by 100 μm or less of silicon. In an example embodiment, preheating radiation source 142 is a laser diode array that emits preheating radiation 147 having a Wavelength of 0.8 μm (800 nm) or 0.78 μm (780 nm). An example embodiment of relay lens 143 is described below. Preheating radiation source 142 and relay lens 143 are operably connected to controller 32.

In operation, preheating radiation source 142 emits radiation 147, which is received by relay lens 143. Relay lens 143 creates a preheating radiation beam 150 that forms an image 165 (e.g., a line image) at substrate surface 12. Preheating radiation beam 150 is incident substrate surface 12 at an incident angle $\theta_{150}$ as measured relative to substrate surface normal N.

In one example embodiment, image 30 formed by annealing radiation beam 20 and image 160 formed by preheating radiation beam 150 are situated side-by-side on substrate surface 12. Thus, preheating radiation beam 150 acts to locally preheat the portion or region of the substrate 130 just in front of the portion being irradiated by annealing radiation beam 20. Arrow 22' illustrates the movement of substrate 10 (e.g., via movable chuck 28), Which in an example embodiment is moved under fixed radiation beams 20 and 150 (or equivalently, fixed images 30 and 160) to effectuate scanning of these beams (or images).

Figure 5:
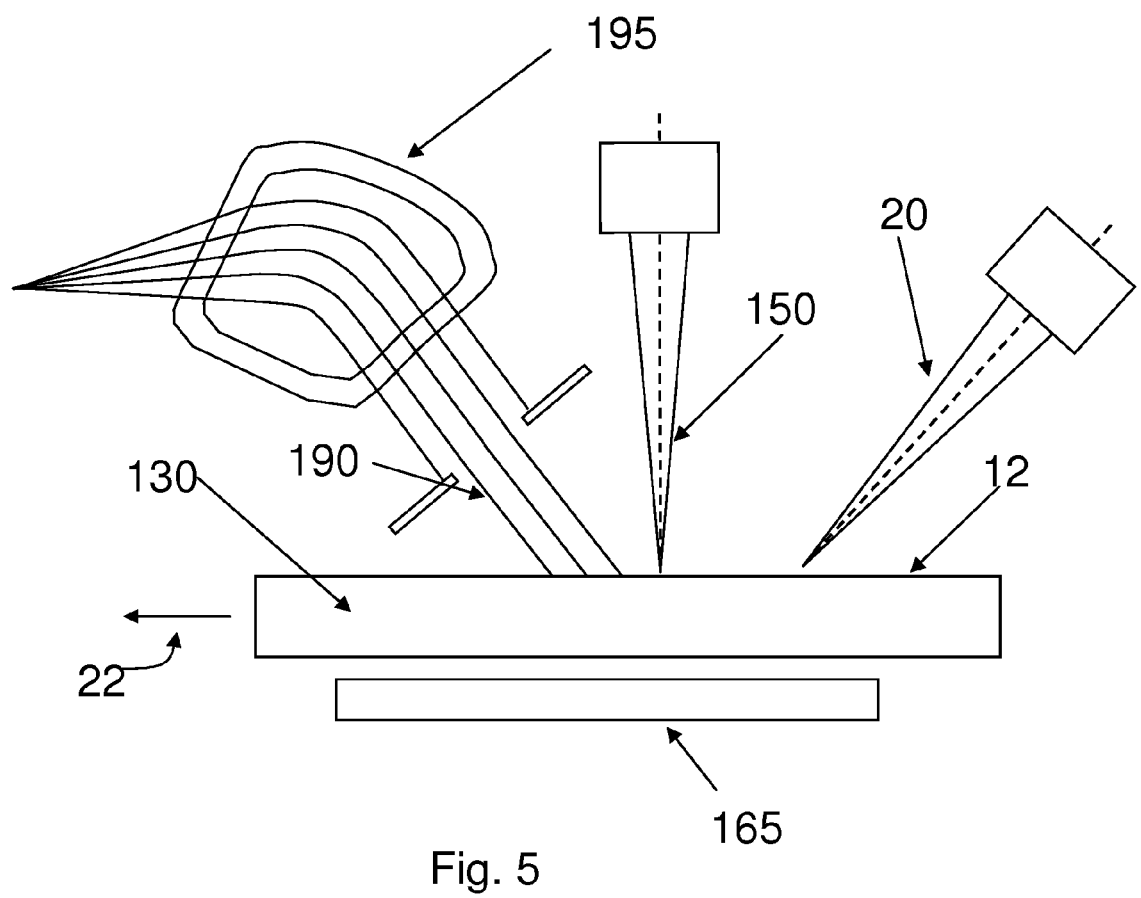
FIG. 5 illustrates an embodiment of the invention wherein a laser beam anneals the surface following the ion beam.

FIG. 5 illustrates an embodiment of the invention wherein a laser beam anneals the surface following the ion beam. Ion source 195 provides an ion beam 190 to the top surface 12 of substrate 130. Substrate 130 is fastened to movable chuck (not shown) that moves in horizontal direction 22 as shown. In this manner the ion beam is swept across the surface 12 of wafer 130. The ion beam 190 sweeps across the substrate 130 and structures such as field effect transistors (155 of FIG. 1) including but not limited to finfets. As the ion beam 190 sweeps across the substrate areas not protected by the resist layer (170 of FIG. 1) will have ions implanted. Immediately trailing the ion beam, in one embodiment within 500 µm of the ion beam, a laser 20 is focused on the surface 12 to anneal the substrate 130. The laser 20 will heat the surface to a temperature of approximately 400° C. for a period of about 1 millisecond. Laser 20 may be an InGaAs laser with a wavelength of 880 nm. By having the laser anneal occur within a short period of time from the time of the ion implantation, the inventors have identified the following benefits. The inventor has determined that upon completion of the ion beam implantation, by immediately performing the laser anneal, the damage caused by amorphization is minimized. While the current embodiment utilizes a wavelength of 880 nm obtained with an InGaAs laser, additional lasers may be utilized such as an Excimer (X1-C1) laser with a wavelength of 308 nm, an Nd-YAG laser with a wavelength of 532 nm, or a CO2 laser with a wavelength of 10.6 um. The laser 20 may be pulsed or continuous.

Figure 6:
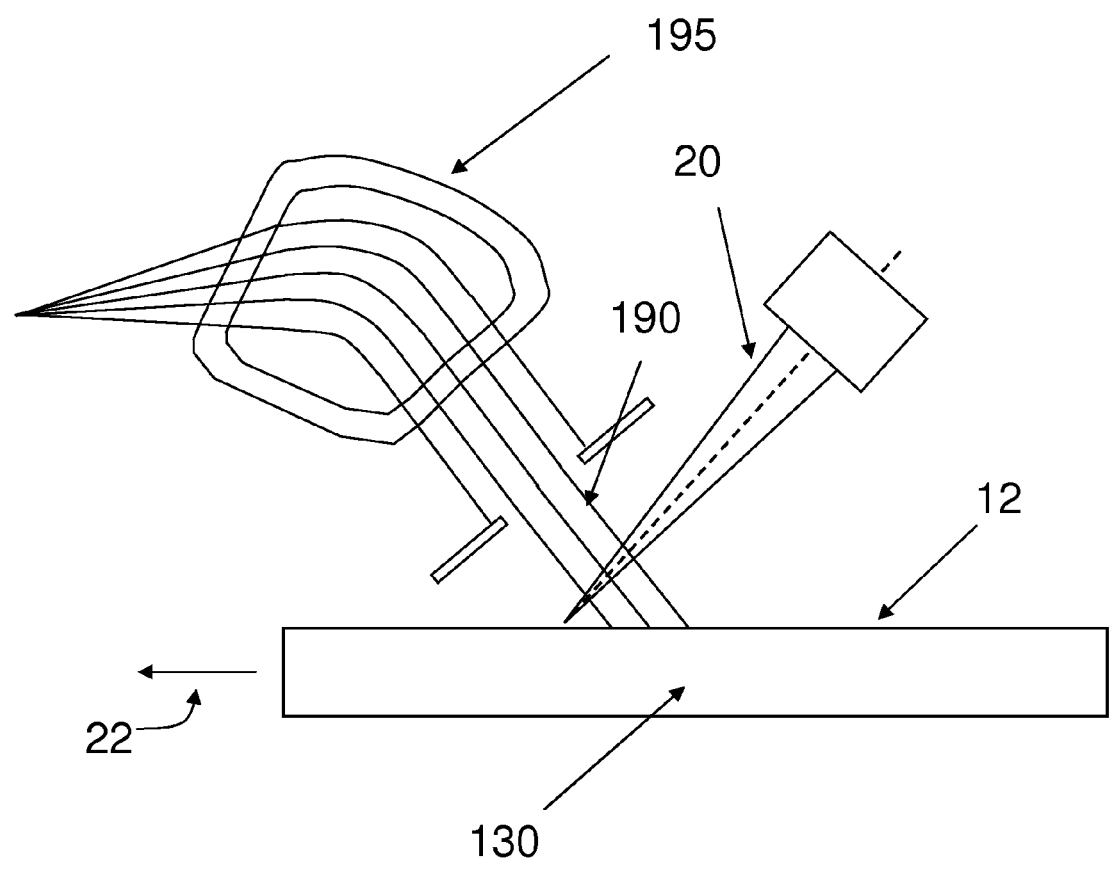
FIG. 6 illustrates an embodiment of the invention wherein a laser beam anneals the surface prior to exposure to the ion beam.

As an alternative, a heating element 165 may be added to pre-heat the wafer to a temperature less than 200° C. In this manner laser 20 need not use as much energy to perform the annealing process. As an additional alternative a pre-heating laser 150 maybe utilized as described in FIG. 4. The inventor has found that the laser 20 alone is sufficient to heat up the wafer surface, that includes the fin, to a temperature in the order of 400 C without damaging the resist FIG. 6 illustrates an embodiment of the invention wherein a laser beam anneals the surface prior to exposure to the ion beam. Ion source 195 provides an ion beam 190 to the top surface 12 of substrate 130. Substrate 130 is fastened to movable chuck (not shown) that moves in horizontal direction 22 as shown. In this manner the ion beam is swept across the surface 12 of wafer 130. The ion beam 190 sweeps across the substrate 130 and structures such as field effect transistors (155 of FIG. 1) including but not limited to finfets. As the ion beam 190 sweeps across the substrate areas not protected by the resist layer (170 of FIG. 1) will have ions implanted. Immediately preceding the ion beam, in one embodiment within 500 µm of the ion beam, a laser 20 is focused on the surface 12 to anneal the substrate 130. Laser 20 may be an InGaAs laser with a wavelength of 880 nm. By preheating the surface with laser 20 prior to providing the ion implantation 190, the inventors have noticed that the surface of the wafer will be brought to a temperature of approximately 400° C., which will reduce the damages caused to the semiconductor fin.

Figure 7:
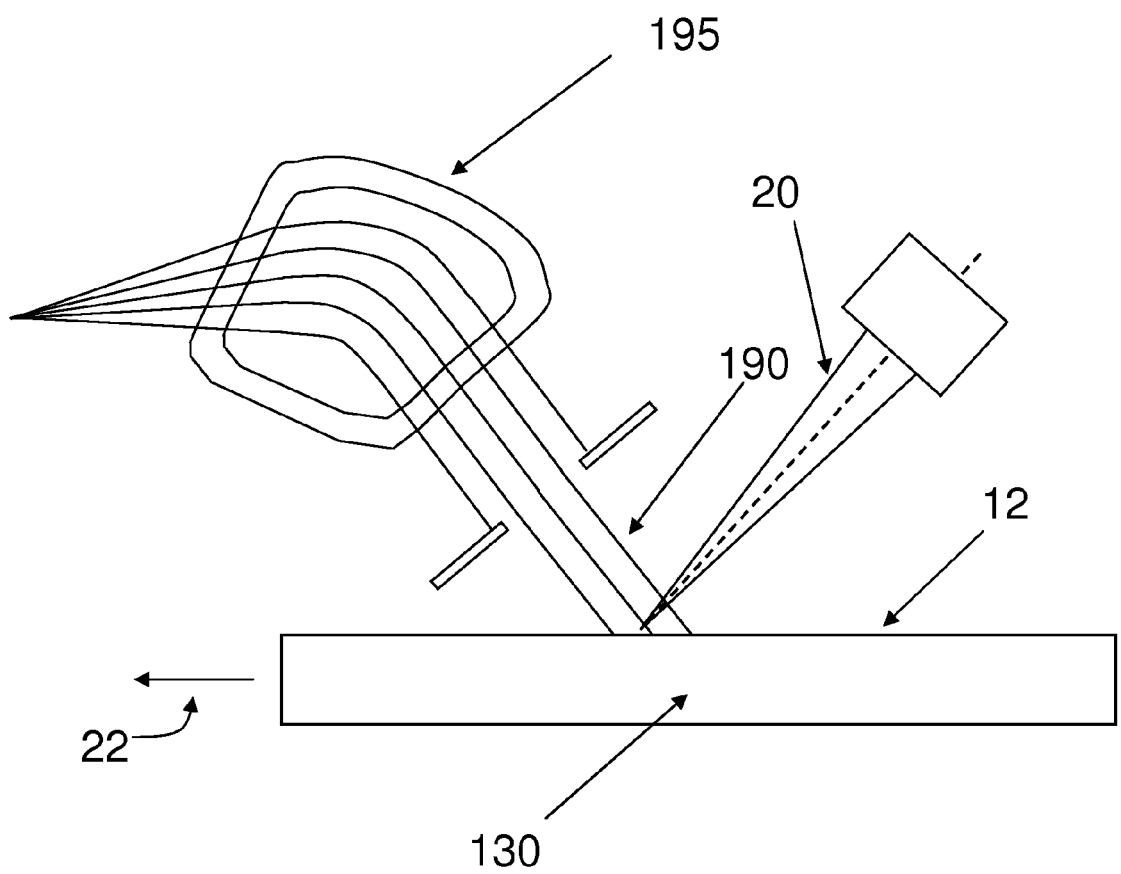
FIG. 7 illustrates an embodiment of the invention wherein a laser beam anneals the surface simultaneously with exposure to the ion beam.

FIG. 7 illustrates an embodiment of the invention wherein a laser beam anneals the surface simultaneously with exposure to the ion beam. Ion source 195 provides an ion beam 190 to the top surface 12 of substrate 130. Substrate 130 is fastened to movable chuck (not shown) that moves in horizontal direction 22 as shown. In this manner the ion beam is swept across the surface 12 of wafer 130. The ion beam 190 sweeps across the substrate 130 and structures such as field effect transistors (155 of FIG. 1) including but not limited to finfets. As the ion beam 190 sweeps across the substrate areas not protected by the resist layer (170 of FIG. 1) will have ions implanted. Simultaneously the laser 20 is focused at the same location as the ion beam 190 on the surface 12 to anneal the substrate 130. By simultaneously annealing a location on the surface 12 and providing the ion implantation 190, the inventors have noted that the surface of the wafer will be brought to a temperature of approximately 400° C., which will reduce the damages caused to the semiconductor fin.

Figure 8:
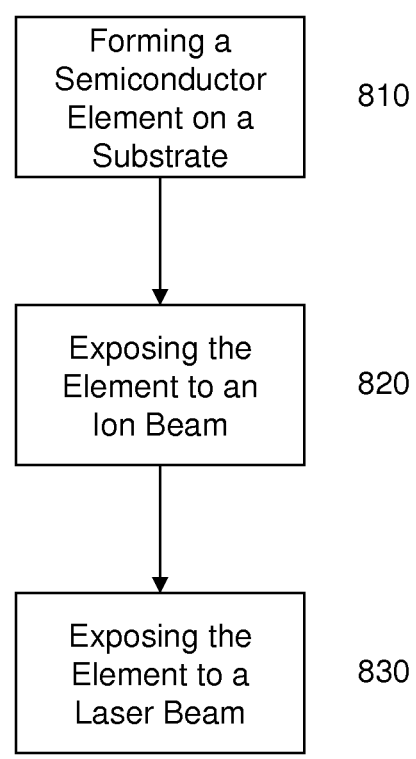
FIG. 8 illustrates a method for exposing a semiconductor element to an ion beam and immediately following with a laser beam.

FIG. 8 illustrates a method for exposing a semiconductor element to an ion beam and immediately following with a laser beam. The first step 810 in the process may be to form a semiconductor element on a substrate. Next the step 820 of exposing the semiconductor element to an ion beam to provide for the deposition of impurities into the element. An additional step 830 of annealing the semiconductor element with a laser. The method of FIG. 8 may be performed utilizing a structure as taught in FIG. 5.

Figure 9:
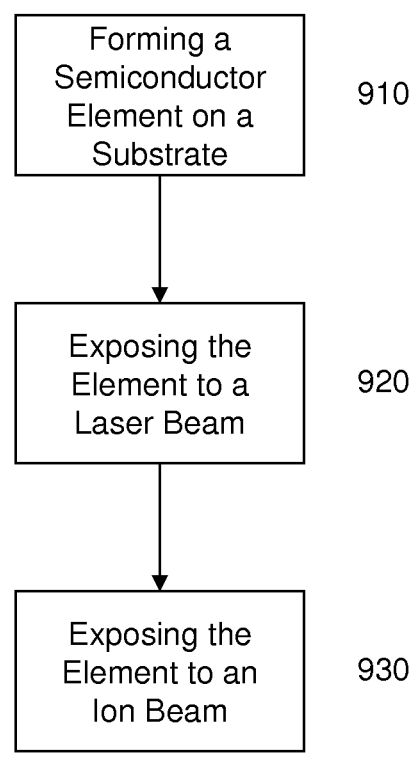
FIG. 9 illustrates a method for exposing a semiconductor element to a laser beam and immediately following with an ion beam.

FIG. 9 illustrates a method for exposing a semiconductor element to a laser beam and immediately following with an ion beam. The first step 910 in the process may be to form a semiconductor element on a substrate. Next the step 920 may be to expose the element to a laser to preheat the element. Next the step of exposing the semiconductor element to an ion beam to provide for the deposition of impurities into the element. The method of FIG. 9 may be performed utilizing a structure as taught in FIG. 6.

Figure 10:
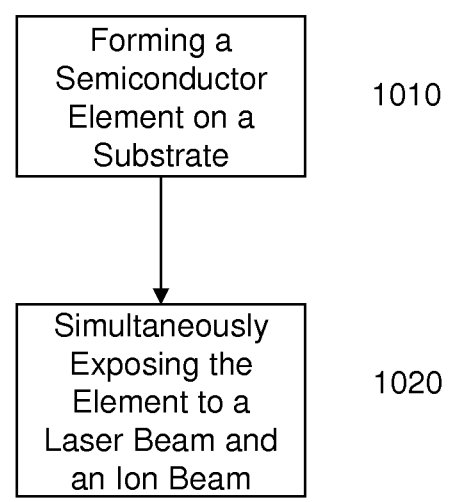
FIG. 10 illustrates a method for simultaneously heating an element with a laser while applying an ion implantation process.

FIG. 10 illustrates a method for simultaneously heating an element with a laser while applying an ion implantation. The first step 1010 in the process may be to form a semiconductor element on a substrate. Next the step 1020 of exposing the semiconductor element to an ion beam to provide for the deposition of impurities into the element. Simultaneously a laser is focused on the same location as the ion beam to simultaneously annealing the semiconductor element with the laser. The method of FIG. 10 may be performed utilizing a structure as taught in FIG. 7.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inven-

What is claimed is:

1. An apparatus comprising:
   an ion implanter for producing an ion beam adapted to implant a substrate; and
   a laser adapted to anneal the substrate;
   wherein the laser is adapted to heat an area of the substrate within a predetermined period of time after an ion implanter implants the area, and
   wherein the laser heats the substrate to a temperature of approximately 400° C.

2. The apparatus of claim 1 wherein the laser is focused about 500 μm behind the ion beam.

3. The apparatus of claim 1 further comprising a second laser to preheat the substrate.

4. The apparatus of claim 1 further comprising a heating element to preheat the substrate.

5. The apparatus of claim 1 wherein the laser heats the substrate for approximately 1 millisecond.

6. The apparatus of claim 1 wherein the substrate does not include a hardmask thereover.

7. An apparatus comprising:
   an ion implanter for producing an ion beam adapted to implant a substrate; and
   a laser adapted to anneal the substrate;
   wherein the laser is adapted to heat an area of the substrate prior to an ion implanter passing implanting the area, and
   wherein the laser heats the substrate to a temperature at or above 400° C.

8. The apparatus of claim 7 wherein the laser is focused about 500 μm before the ion beam.

9. The apparatus of claim 7 further comprising a second laser to preheat the substrate.

10. The apparatus of claim 7 further comprising a heating element to preheat the substrate.

11. An apparatus comprising:
    an ion implanter for producing an ion beam adapted to implant on a substrate; and
    a laser adapted to anneal the substrate;
    wherein the laser is adapted to heat an area of the substrate simultaneously while an ion implanter implants the area,
    wherein the laser heats the substrate to a temperature at or above 400° C.

12. The apparatus of claim 11 further comprising a second laser to preheat the substrate.

13. The apparatus of claim 11 further comprising a heating element to preheat the substrate.

14. A method comprising the steps of:
    forming a semiconductor element on a substrate;
    exposing said semiconductor element to an ion beam;
    promptly exposing said semiconductor element to a laser beam to heat the area exposed to the ion beam to temperature at or above 400° C. and anneal the semiconductor element.

15. The method of claim 14 further comprising the step of preheating the substrate.

16. A method comprising the steps of:
    forming a semiconductor element on a substrate;
    exposing said semiconductor element to a laser beam to heat the semiconductor element above a predetermined temperature;
    promptly exposing said semiconductor element to an ion beam while the semiconductor is above the predetermined temperature,
    wherein the predetermined temperature includes 400° C.

17. The method of claim 16 further comprising the step of preheating the substrate.

18. A method comprising the steps of:
    forming a semiconductor element on a substrate; and
    concurrently exposing a section of the semiconductor element to a laser beam and an ion beam, wherein the laser beam heats the section of said semiconductor element to a predetermined temperature,
    wherein the predetermined temperature includes 400° C.

19. The method of claim 18 further comprising the step of preheating the substrate.

* * * * *